United States Patent [19]

Doctor et al.

[11] 4,441,023
[45] Apr. 3, 1984

[54] HIGH OUTPUT DIFFERENTIAL PYROELECTRIC SENSOR

[75] Inventors: Alan P. Doctor, Ormond Beach; Friedrich H. Oettel, Daytona Beach, both of Fla.

[73] Assignee: Eltec Instruments, Inc., Daytona Beach, Fla.

[21] Appl. No.: 288,192

[22] Filed: Jul. 29, 1981

[51] Int. Cl.$^3$ .............................................. G01J 5/10
[52] U.S. Cl. .................................. 250/338; 250/342; 250/349
[58] Field of Search ............... 250/338, 342, 349, 340; 374/177; 307/400; 29/25.35

[56] References Cited

U.S. PATENT DOCUMENTS

| | | | |
|---|---|---|---|
| 3,877,308 | 4/1975 | Taylor | 250/338 |
| 3,896,309 | 7/1975 | Halsor et al. | 250/370 |
| 3,940,974 | 3/1976 | Taylor | 250/338 |
| 4,060,729 | 11/1977 | Byer et al. | 250/338 |
| 4,110,616 | 8/1978 | Porter et al. | 250/338 |
| 4,258,260 | 3/1981 | Obara et al. | 250/338 |
| 4,334,343 | 6/1982 | Wakat, Jr. et al. | 29/25.35 |

*Primary Examiner*—Alfred E. Smith
*Assistant Examiner*—Carolyn E. Fields
*Attorney, Agent, or Firm*—Duckworth, Allen, Dyer & Pettis

[57] ABSTRACT

A dual pyroelectric crystal sensor suitable for infrared intruder alarms and the like having two separate closely spaced identical pyroelectric crystal detectors connected in parallel opposition. The sensor includes a single ended field effect transistor amplifier with the entire sensor encapsulated in a TO-5 can. The two crystals each have one end cemented to a ceramic substrate in a cantilevered fashion, permitting shock or vibration to affect each crystal equally. Therefore, voltages due to the piezoelectric responses of the crystals are equal and cancel. If both crystals are irradiated by a common heat source, the pyroelectric generated voltages will cancel. If either crystal is irradiated separately, an output voltage will be produced.

22 Claims, 5 Drawing Figures

HIGH OUTPUT DIFFERENTIAL PYROELECTRIC SENSOR

BACKGROUND OF THE INVENTION

1. Field of the Invention

The present invention relates to a pyroelectric thermal radiation sensor and more particularly to a pyroelectric thermal radiation sensor having two elements connected in parallel opposing fashion and mechanically mounted so as to null out vibration and to provide good low frequency response.

2. Description of the Prior Art

The use of pyroelectric sensors using polarized crystals and plastic films for detection of thermal radiation is well known. There have been many uses developed for such pyroelectric sensors. One important application is in the field of intruder alarms in which a pyroelectric sensor is arranged to detect the infrared radiation from a human being as an indication of an intruder. However, some prior art intruder alarms can be falsely triggered by other sources of infrared radiation such as hot air from a heating system, sunlight, or equipment which may give off heat radiation. To discriminate between an actual intruder and such environmental effects, it is known to require movement of the source of heat. For this purpose, it is common to utilize at least two collocated sensors in a differential connection so as to produce zero net signal output when both sensors are irradiated and to produce multiple pulse outputs when a person walks past the device. A typical example is shown in U.S. Pat. No. 3,839,640 to Rossin which teaches the use of two pyroelectric sensors formed from a single piece of polyvinylidene fluoride ($PVF_2$) plastic film. This patent shows two such sensors connected in series opposition. There are several basic problems with the series opposition detector. One problem is that an output voltage produced by one of the sensors is required to cause a current to flow through the non-energized sensor which is of an extremely high impedance. Unfortunately, this greatly reduces the sensitivity of the device. Some series opposition type differential sensors utilize a single pyroelectric crystal or element which causes an additional loss of sensitivity. For example, the Rossin detector, which uses a single $PVF_2$ film, has a floating rear electrode and two front electrodes such that a series opposition connection is obtained with respect to the two front electrodes. Since the $PVF_2$ film is a good conductor of heat, heating of one sensor results in conduction of heat to the non-excited sensor. This generates a common mode signal which reduces the net output signal. It is also necessary to provide a backing for $PVF_2$ film which can act as a heat sink which reduces the response to low frequency source (slow moving targets).

Pyroelectric crystals have been found to be much superior to pyroelectric $PVF_2$ films since the plastic film is flimsy and easily damaged. The output for a given area $PVF_2$ sensor is much less than for crystal types. Liu, in U.S. Pat. No. 3,816,750, discloses a series opposing connected differential sensor utilizing a polarized crystal which, although producing a higher output than the $PVF_2$ type, suffers from the reduction in sensitivity common to this connection. As is well known, the resistivitiy of the inorganic pyroelectric crystals is very high. When the common electrode is left floating, electrostatic charges can build up on one or the other element which can cause random noise and biasing problems when directly coupled to field effect transistor (FET) type amplifiers.

It is also known in the prior art to connect two pyroelectric sensors in parallel opposition. Such connection will also reject signals produced by radiation common to both elements and has the advantage of a much higher sensitivity and output when only one sensor is energized. Such units also are free of the static build up problem. Typical of this type of device are the structures disclosed in U.S. Pat. No. 3,877,308 to Taylor and of McHenry in U.S. Pat. No. 3,453,432. Each disclosures a pyroelectric radiation detector having at least two parallel opposed connected sensors. McHenry teaches one sensor especially adapted to detect incoming radiation and the second sensor shielded from incoming radiation such that the pair of sensors will be compensated for environmental temperature changes.

A basic problem with all pyroelectric detectors, either crystal or plastic film, is that they also tend to be piezoelectric as well as pyroelectric. False signals can be generated due to vibration or other bending forces applied to such sensors. This characteristic can result in false alarms in intrusion detection applications.

The mounting of pyroelectric crystals introduces problems when good low frequency response is required. For example, the McHenry differential detector is mounted on a heat sink. When a slowly varying thermal radiation is incident on the McHenry sensor, an initial temperature gradient will occur across the crystal, but, due to the very high heat conductivity of the crystal, heat will flow into the heat sink, greatly reducing the gradient and therefore the output voltage. Taylor discloses only a sensor and does not consider the mounting problem. As previously mentioned, it is not desirable to utilize a single crystal having dual electrodes since the common mode created by heat flow from one element to the other reduces sensitivity. However, the use of two separate detectors in a differential sensor introduces the problem of false signals due to vibrations and the piezoelectric effect. Thus, there is a need for a high output differential thermal radiation sensor having common mode cancellation for both pyroelectric and piezoelectric signals and that will be sensitive to slowly varying thermal radiation.

SUMMARY OF THE INVENTION

The present invention is a compensated pyroelectric sensor suitable for intruder alarms and the like having two separate but closely spaced lithium tantalate pyroelectric crystal detectors connected in parallel and poled such that output connections of opposite polarity are connected to each other. The dual sensor thus formed produces a much greater output voltage when one crystal is irradiated than would occur if the two detectors were connected series opposing. Similarly, the output voltage is greater than that from two sensors having a common crystal since common molding is essentially eliminated. The sensor of the invention is constructed with two identical rectangular pyroelectric crystals having electrodes on each side in which one end of each crystal is cemented to a common ceramic substrate in a cantilevered fashion. This novel construction permits both crystals to vibrate or more together due to any mechanical vibration imparted through the structure. Thus, any voltages produced by the piezoelectric response of the two crystals will have equal amplitude but opposite polarity and will therefore cancel. Similarly, if both crystals are irradiated by a common heat source, the voltage produced due to the pyroelectric effect will also cancel. The ceramic substrate may have a pair of deposited electrodes to which the crystal electrodes are attached with conductive epoxy cement thereby permitting the substrate electrodes to be conveniently used for output connections for the sensor.

Due to the high output of the sensor of the invention, the detector elements may be very small and may be mounted within a TO-5 can assembly along with a high megohm load resistor and an FET transistor or operational amplifier. The can cover may have a window with a narrow optical filter selected for the desired radiation wavelength. For example, an infrared (IR) detector for use in an intruder alarm may utilize a germanium window passing radiation in the 7 to 12 micron region.

It is therefore a principal object of the invention to provide a differential pyroelectric thermal radiation sensor that is compensated for changes in ambient temperature and for piezoelectric generated signals due to shock or vibration.

It is another object of the invention to provide a pyroelectric differential sensor having a response to very low frequency radiation.

It is yet another object of the invention to provide a pyroelectric sensor having two separate pyroelectric detectors attached to a common substrate having a low rate of heat transfer from the detectors to the substrate.

It is still another object of the invention to provide a pyroelectric sensor having two heat detectors attached to a common substrate with a low heat conductive path between the detectors to minimize or eliminate the common mode signal when only one of the detectors is energized.

It is a further object of the invention to provide a differential pyroelectric sensor having a much greater sensitivity than prior art series opposed differential pyroelectric sensors.

It is yet a further object of the invention to provide a differential pyroelectric sensor having a much greater sensitivity than prior art dual sensors fabricated on a common crystal.

It is still a further object of the invention to provide a miniature differential pyroelectric sensor mountable in a TO-5 can.

It is another object of the invention to provide a differential sensor suitable for an intruder alarm mounted in a TO-5 can with a load resistor and an FET type amplifier.

These and other objects and advantages of the invention will be apparent from the following detailed description and the drawings.

DETAILED DESCRIPTION OF THE PREFERRED EMBODIMENT

Figure 1:
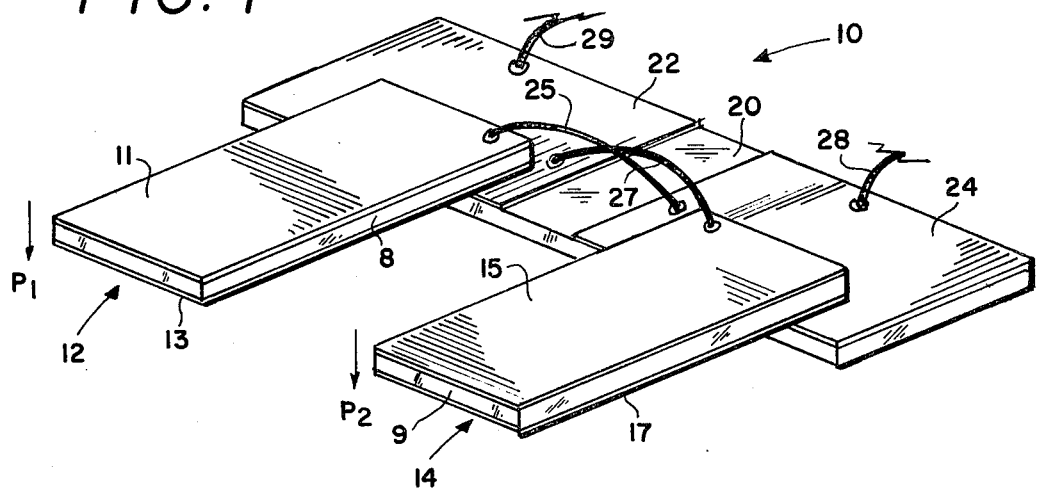
FIG. 1 is a perspective view of the differential sensor of the invention.

Referring to FIG. 1, the differential pyroelectric crystal sensor element 10 is shown unmounted and in perspective view. A rectangular ceramic substrate or base 20 has a first electrode 22 and a second electrode 24 deposited thereon. Two pyroelectric detectors 12 and 14 are formed from two identical pyroelectric crystals 8 and 9 and are fabricated to have identical electrical and mechanical characteristics. Crystal 8 has an upper electrode 11 which may cover the entire top surface of the crystal, and a lower electrode 13 covering the bottom surface. Crystal 8 is polarized as shown by arrow P1 such that electrode 11 will be positive when detector 12 is thermally irradiated. Detector 14 is identical, having upper electrode 15 and lower electrode 17 deposited on crystal 9. A preferred pyroelectric crystal material is lithium tantalate, although other suitable types will be obvious to those of skill in the art. Crystals 8 and 9 are preferably cut from a single polarized crystal and have the same dimensions to ensure equal response from each detector.

Each detector 12, 14 is cemented to electrodes 22 and 24 respectively by the use of conductive epoxy so as to also form electrical connections. As may be noted, the upper electrode 11 of detector 12, considered to be the positive electrode, is connected by lead 25 to electrode 24 and to the lower, or negative, electrode 17 of detector 14. Similarly, positive electrode 15 is connected by lead 27 via electrode 22 to negative electrode 13. These connections thus connect detectors 12 and 14 in parallel opposition. Leads 29 and 28 represent the outputs from sensor 10.

Assume that thermal radiation is incident on detector 12 and detector 14 is at thermal equilibrium with the ambient temperature. A temperature gradient will occur across crystal 8 producing a voltage between electrodes 11 and 13. This action produces an output voltage between leads 28 and 29, with lead 28 having a positive polarity. When the incident radiation ceases, the gradient disappears as the temperatures of detectors 12 and 14 become equalized. The resulting output voltage between leads 28 and 29 is then zero.

If the ambient temperature changes, or thermal radiation is incident equally on detectors 12 and 14, the output voltages from the detectors are equal but of opposite polarities. Therefore, such common mode voltages cancel out and the output voltage between leads 28 and 29 remains at zero. When the sensor 10 of the invention is used in an intrusion alarm, no output will occur when sunlight, warm air from a heater, or other environmental temperature changes in incident on detectors 12 and 14 equally.

Advantageously, the sensor 10 will respond to low frequency radiation such as from an intruder moving slowly in the field of one detector. As may be noted from FIG. 1, detectors 12 and 14 are cantilevered from substrate 20 with a relatively small area in thermal contact with electrodes 22 and 24. Therefore, a slowly varying incident radiation will result in a corresponding temperature gradient variation over the major portion of the detector since the heat sink ability of substrate 20 has been minimized. The long thermal path between detectors 12 and 14 prevents production of a common mode voltage when only one detector is energized.

Figure 2:
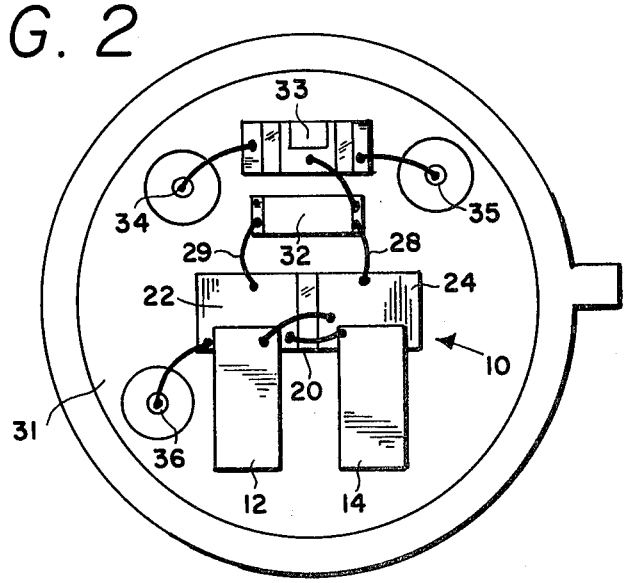
FIG. 2 is a plan view of a TO-5 can header having the differential sensor of FIG. 1 mounted thereon along with the load resistor and an FET amplifier.

Turning now to FIG. 2, a preferred mounting of sensor 10 is shown by a top view of a TO-5 header 30. Detectors 12 and 14 may have dimensions of 0.5 mm by 2 mm, and may be spaced about 1 mm. Ceramic substrate 20 may be cemented to header 31 or supported by shock absorbing mountings. However, due to the novel cantilever mounting of detectors 12 and 14, even a rigid mounting of substrate 20 will not result in false signals due to vibration or shock since each detector will vibrate equally and generate opposite polarity, equal voltages.

Output leads 29 and 28 are connected to high megohm resistor 32 which forms the load resistor for the high impedance sensor 10. A typical value is 50,000 megohms. Header lead 36 is utilized as the ground connection and connects to substrate electrode 22. The high terminal of load resistor 32 connects to the gate of FET 33 whose outputs connect to header leads 34 and 35. FET 33 may be a 2N4117.

Figure 4:
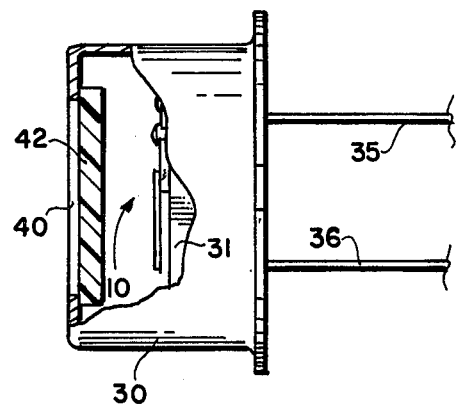
FIG. 4 is a cutaway side view of the device of FIG. 2 having the TO-5 can cover in place and showing the window and filter in the cover.

A cutaway view of the TO-5 can assembly is shown in FIG. 4 illustrating window 40 having filter 42 installed therein. A typical filter characteristic for filter 42 suitable for an intruder alarm may have a rejection band of 0.5 to 6 $\mu$m, a passband of 7 to 12 microns, and a transition band of 6 to 7 $\mu$m.

Figure 3:
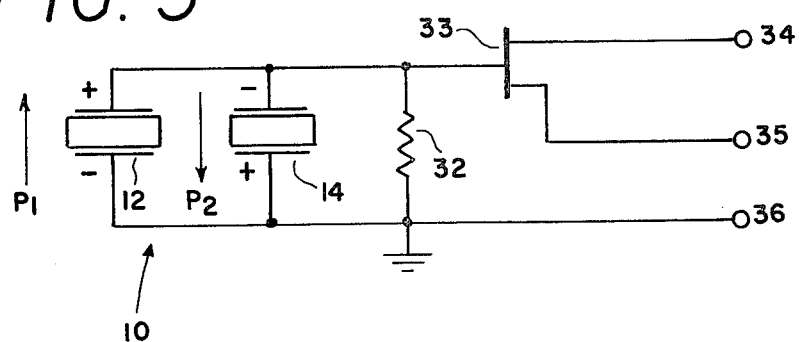
FIG. 3 is a schematic diagram of the device shown in FIG. 2.

The equivalent schematic circuit of the sensor is shown in FIG. 3. Detectors 12 and 14 are connected electrically in parallel. However, the positive electrode of detector 12 is connected to the negative electrode or detector 14 thus providing the required parallel opposed connection. The parallel opposed sensor 10 thus produces a voltage across load resistor 32 only when the thermal energies incident on the two detectors 12, 14 are not equal. Any output voltage from sensor 10 drives FET 33. As will be understood, the load and power source for FET 33 are supplied external to the TO-5 unit.

ALTERNATIVE EMBODIMENT

Figure 5:
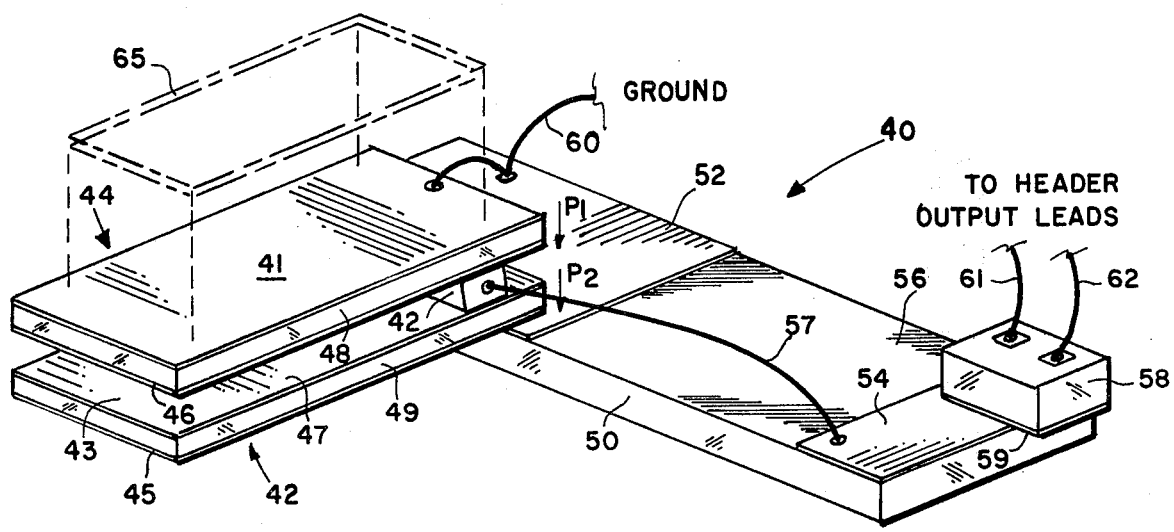
FIG. 5 shows a perspective view of an alternative configuration of the sensor of the invention for use as a single element heat detector which is compensated for changes in the ambient temperature and for vibration and shock.

The above described embodiment is especially suitable for intruder alarms and the like since the infrared radiation from a person may be focused on the sensor such that as the person moves through the field of view an output will be obtained from one of detectors and as the person moves into the field of view of the second detector, an opposite polarity output will then be obtained from that detector. This dual sequential signal thus obtained may be analyzed by logic circuits to indicate presence of an intruder. However, there are applications for a compensated heat detector in which only a single output signal is obtained. Referring to FIG. 5, an alternative embodiment of the sensor of the present invention is shown which is particularly suitable for such application. The unit may be used for quantitative measurements of the amount of heat falling on the sensor as well as for heat detector purposes. This embodiment includes a pair of pyroelectric detectors 42 and 44 which may be identical to detectors 12 and 14 previously described with reference to FIG. 1. The detectors 42 and 44 are connected in parallel opposing by the use of a conductive block 42 cemented with conductive epoxy to upper electrode 47 of detector 42 and to lower electrode 46 of detector 44. A ceramic substrate 50 includes an electrode 52 to which lower electrode 45 of detector 42 is attached by conductive epoxy. Detectors 42 and 44 are arranged as shown with the polarity of pyroelectric crystal 48 shown by the arrow P1 and the polarity of pyroelectric crystal 44 as shown by the arrow P2. As will now be understood, upper electrode 41 of detector 44 will produce a positive voltage when energized, and lower electrode 46 will produce a negative voltage. Similarly, upper electrode 43 will be positive when detector 42 is energized and lower electrode 45 will be negative. Lead 60 from upper electrode 41 to substrate electrode 52 therefore serves to connect the positive electrode of detector 44 to the negative electrode of detector 42 and mounting block 42 serves to connect the positive electrode 43 of detector 42 to the negative electrode 46 of detector 44. Substrate 50 has a second electrode 54 deposited at the opposite end from electrode 52 with the space in between having a high resistance material 56 coated thereon thereby producing a high megohm resistor. Conductive block 42 is connected to substrate electrode 54 by lead 57 such that the resistance produced by coating 56 is in parallel with the parallel opposed connection of detectors 42 and 44 in exactly the same manner as previously shown in FIG. 3. FET 58 is attached by conductive epoxy to electrode 54 by its gate electrode 59 while its source and drain connections are connected to the header output terminals by leads 61 and 62.

Although not shown, the sensor 40 of FIG. 5 may be mounted on the header of a TO-5 can in a manner similar to that of FIG. 2 previously described. A window and filter are disposed in the TO-5 can cover as previously shown in FIG. 4 and as indicated by the phantom lines 65 in FIG. 5. In this implementation, window 65 is located such that radiation passing therethrough can only be incident on pyroelectric detector 44 which serves to shield pyroelectric detector 42 from incident radiation. Therefore, an output signal from the sensor will occur only when such radiation is present. As the ambient temperature of the assembly changes, equal and opposite voltages will be developed across detectors 44 and 42, and by virtue of the parallel opposed connection, will cancel out with no net voltage resulting. As in the first embodiment described, the thermal conductivity path between detector 44 and detector 42 minimizes or eliminates a common mode signal when detector 44 is irradiated. The cantilever mounting also causes equal and opposite polarity signals from detectors 42 and 44 when the device is shocked or experiences vibration.

As will be apparent to those of skill in the art, the two embodiments of the invention described hereinabove are admirably suited for use as an intrusion detector. Referring to FIG. 4, the unit may be mounted so that infrared radiation from a body moving through an area to be detected will fall on the sensor 10, producing an output from FET 33. For the embodiment of FIG. 1, a pulse of one polarity will be generated when one of the two detectors is irradiated, followed by an opposite polarity pulse as the body moves, irradiating the other detector. The embodiment of FIG. 5 will produce a single pulse as the body moves across the field of view of the sensor.

Advantageously, changes in ambient temperature, which generally are very slow, will affect both detector elements equally and therefore will not produce false detections of intruders. The unit of FIG. 1 also is immune to sunlight, drafts of hot air from heating systems and the like since both detectors would be irradiated simultaneously from such sources.

Although the invention has been disclosed with reference to two specific embodiments, it will be obvious to those of skill in the art that a number of the construction features shown may be modified without departing from the spirit or scope of the invention. For example, the sizes of the various elements, the type of pyroelectric crystal material utilized, and the type of amplifier can be readily changed.

I claim:

1. A differential thermal sensor having compensation for variations in ambient temperature and for mechanical vibration comprising:
   a first elongate thermal detector having a polarized pyroelectric crystal disposed between two conductive electrodes;
   a second elongate thermal detector identical to said first thermal detector and having a polarized pyroelectric crystal disposed between two conductive electrodes;
   a mounting base, said first detector mounted on said base and extending therefrom in a cantilevered manner, and said second detector mounted on said base adjacent said first detector and extending from said base in a cantilevered manner; and
   a pair of conductors conductively attached to said electrodes of said first and second detectors so as to form a parallel opposing connection of said detectors, said pair of conductors also forming output connections for said sensor.

2. The sensor as defined in claim 1 in which said crystals of said first and second detectors are formed from lithium tantalate.

3. The sensor as defined in claim 1 including means for minimizing common mode signals, said means comprising said base formed from low thermal conductivity material for thermally isolating said first detector and said second detector.

4. The sensor as defined in claim 1 including means for extending the low frequency response of said sensor, said means comprising said base formed from low thermal conductivity material for thermally isolating said first detector and said second detector.

5. The sensor as defined in claim 1 in which said detectors are essentially rectangular and extend from said base essentially parallel with each other, said two detectors having identical electrical and mechanical characteristics.

6. The sensor as defined in claim 5 in which:
   said base is a rectangular ceramic substrate having a pair of substrate electrodes disposed on one surface thereof;
   said first detector is mounted on said substrate by conductive cement between one of said first detector electrodes and one of said substrate electrodes; and
   said second detector is mounted on said substrate by conductive cement between one of said second detector electrodes and the other one of said substrate electrodes.

7. The sensor as defined in claim 6 which further comprises:
   a load resistor connected between said pair of substrate electrodes; and
   amplifier means connected to said sensor output connections for amplification of voltages produced by said sensor.

8. The sensor as defined in claim 7 in which said amplifier means is a field effect transistor.

9. The sensor as defined in claim 8 which further comprises a header having output leads, said ceramic substrate, said load resistor, and said field effect transistor mounted on said header, said output leads connected to the output of said field effect transistor.

10. The sensor as defined in claim 9 which further comprises:
    a cover for said header, said cover having a window adjacent said first and second detectors such that external radiation may be incident on said detectors; and
    optical filter means disposed over said window for passing thermal energy of a selected range of wavelengths.

11. A differential thermal sensor having an extended low frequency response and compensation for ambient temperature variation and for vibration comprising:
    a ceramic substrate having first and second electrodes on one surface thereof;
    a first pyroelectric crystal detector having a positive electrode and a negative electrode, said first detector having a small portion of one of said positive and negative electrodes conductively attached to said first substrate electrode so as to cantilever said first detector from said substrate;
    a second pyroelectric crystal detector having a positive electrode and a negative electrode, said second detector having a small portion of one of said positive and negative electrodes conductively attached to said second substrate electrode adjacent to and essentially parallel to said first detector so as to cantilever said second detector from said substrate; and
    electrical connections between said first and second detectors for connecting the positive electrode of said first detector to the negative electrode of said second detector, and the negative electrode of said first detector to the positive electrode of said second detector.

12. The sensor as defined in claim 11 in which said first and second detectors each include a polarized lithium tantalate crystal, each of said detectors having identical electrical and physical characteristics.

13. An intrusion detection device having ambient temperature compensation and vibration compensation comprising:
    a header having a ground lead and a pair of output leads;
    a pyroelectric differential sensor having a rectangular ceramic substrate, a pair of rectangular pyroelectric crystal detectors attached to and cantilevered from said substrate, electrical connections connecting said pair of detectors in a parallel opposing connection, and first and second output leads from said sensor;
    a load resistor connected in parallel with said output leads, said second output lead also connected to said header ground lead; and
    amplifier means having an input and a pair of output terminals, said input connected to said first sensor output lead and said pair of output terminals connected to said pair of header output leads.

14. The device as defined in claim 13 further comprising:
    a header cover having a window opening therein, said window opening adjacent said pair of detectors whereby external radiation may be directed to either or both of said detectors; and an optical filter disposed in said window for restricting the wavelength of radiation incident on said sensor to a desired portion of the spectrum.

15. The device as defined in claim 14 in which said optical filter passes radiation in the infrared portion of the spectrum.

16. The device as defined in claim 13 in which said pair of pyroelectric crystal detectors is formed from polarized lithium tantalate.

17. A differential thermal sensor having extended low frequency response and compensation for ambient temperature variations and for vibration comprising:
a mounting base;
a first pyroelectric detector having front and rear electrodes, said first detector having a small portion of said rear electrode attached to said base so as to cantilever said first detector from said base;
a second pyroelectric detector having front and rear electrodes;
a spacer attached to said front electrode of said first detector adjacent to the small attachment portion of said first detector, a small portion of said rear electrode of said second detector attached to said spacer so that said rear electrode of said second detector is in parallel opposition to said front electrode of said first detector, said second detector thereby serving to prevent radiation incident on said front electrode of said second detector from falling on said first detector; and
electrical connections between said first and second detectors for connecting said first detector and said second detector in a parallel opposing electrical connection.

18. The sensor as defined in claim 17 in which:
said front electrodes of said first and second detectors are of a positive polarity and said rear electrodes of said first and second detectors are of a negative polarity; and
said spacer is electrically conducting for serving as an electrical connection between said rear electrode of said second detector and said front electrode of said first detector.

19. The sensor as defined in claim 18 in which said first and second detectors are essentially rectangular in shape and have essentially identical electrical and mechanical characteristics.

20. The sensor as defined in claim 18 in which said mounting base comprises:
an elongate ceramic substrate having a flat surface;
a first electrode on one surface of one substrate, said electrode representing the point of attachment of said first detector to said face;
a second electrode on said surface spaced apart from said first electrode; and
resistance material deposited on said surface between said first and second electrodes for forming a load resistor for said parallel opposed connected first and second detectors, said second electrode connected to said electrically conducting spacer.

21. The sensor as defined in claim 20 which further comprises a field effect transistor having its input connected to the output of said parallel opposed connected first and second detectors.

22. The sensor as defined in claim 21 which further comprises:
an enclosure having mounting means for mounting said base;
said enclosure having output leads for connecting to said field effect transistor;
said enclosure having a window opening adjacent to and aligned with said second detector for admitting thermal radiation onto said front electrode of said second detector; and
optical filter means in said window opening for limiting said radiation to a desired portion of the spectrum.

* * * * *